United States Patent
Reinisch

(10) Patent No.: US 11,376,838 B2
(45) Date of Patent: Jul. 5, 2022

(54) PRINTING APPARATUS WITH ROTATABLE TRANSPORT PENDULUMS

(71) Applicant: EKRA AUTOMATISIERUNGSSYSTEME GMBH, Bönnigheim (DE)

(72) Inventor: Hubert Reinisch, Freiberg am Neckar (DE)

(73) Assignee: EKRA AUTOMATISIERUNGSSYSTEME GMBH, Bönnigheim (DE)

( * ) Notice: Subject to any disclaimer, the term of this patent is extended or adjusted under 35 U.S.C. 154(b) by 285 days.

(21) Appl. No.: 16/495,126

(22) PCT Filed: Mar. 20, 2018

(86) PCT No.: PCT/EP2018/056930
§ 371 (c)(1),
(2) Date: Sep. 18, 2019

(87) PCT Pub. No.: WO2018/172305
PCT Pub. Date: Sep. 27, 2018

(65) Prior Publication Data
US 2020/0016886 A1  Jan. 16, 2020

(30) Foreign Application Priority Data
Mar. 20, 2017 (DE) .................. 10 2017 204 630.9

(51) Int. Cl.
*B41F 15/08* (2006.01)
*B41F 15/26* (2006.01)
(Continued)

(52) U.S. Cl.
CPC ........ *B41F 15/18* (2013.01); *H01L 21/67703* (2013.01)

(58) Field of Classification Search
CPC .... B41F 15/08; B41F 15/26; H01L 21/67715; H01L 21/677; H01L 21/6773; H05K 3/1216; H05K 3/1233
(Continued)

(56) References Cited

U.S. PATENT DOCUMENTS

| 8,763,524 B2 | 7/2014 | Dumenil | |
| 8,869,692 B2* | 10/2014 | Van Der Avoort | B65G 35/04 101/126 |
| 2002/0090289 A1* | 7/2002 | Comulada, Jr. | H05K 3/00 414/788 |

(Continued)

FOREIGN PATENT DOCUMENTS

| CN | 101961947 A | 2/2011 |
| CN | 102909941 A | 2/2013 |

(Continued)

OTHER PUBLICATIONS

Written Opinion received for the Singapore Patent Application No. 11201908742R, dated Nov. 18, 2020, 7 pages.
International Search Report (in English and German) and Written Opinion (in German) issued in PCT/EP2018/056930, dated May 18, 2018; ISA/EP.

*Primary Examiner* — Leslie J Evanisko
(74) *Attorney, Agent, or Firm* — Harness, Dickey & Pierce, P.L.C.; Stephen T. Olson

(57) ABSTRACT

A printing apparatus for printing substrates, in particular solar cells, wafers, circuit boards or the like, has at least one printing device, which is assigned at least one movable printing table, having a conveyor track along which the substrates can be moved, and having a transport device for transporting the substrates from the conveyor track to the at least one printing device and back. The transport device has at least one transport pendulum which can be pivoted or rotated about a pendulum axis and which has the printing table at at least one end at a distance from the pendulum axis. The printing table can be pivoted by the transport pendulum (Continued)

into a first position assigned to the printing device for a printing operation and into a second position lying in the conveyor track. The printing table has a conveying device which also forms the conveyor track in the second position of the printing table.

12 Claims, 2 Drawing Sheets

(51) Int. Cl.
*B41F 15/18* (2006.01)
*H01L 21/677* (2006.01)

(58) Field of Classification Search
USPC .......................................................... 101/126
See application file for complete search history.

(56) References Cited

U.S. PATENT DOCUMENTS

| | | | |
|---|---|---|---|
| 2009/0305441 A1* | 12/2009 | Baccini | H01L 21/68764 |
| | | | 438/16 |
| 2009/0320699 A1 | 12/2009 | Dumenil | |
| 2012/0034382 A1 | 2/2012 | Baccini et al. | |
| 2015/0030418 A1 | 1/2015 | Reichenbach et al. | |

FOREIGN PATENT DOCUMENTS

| | | |
|---|---|---|
| DE | 102012205252 A1 | 10/2013 |
| EP | 2138305 A2 | 12/2009 |
| WO | WO-2009030284 A1 | 3/2009 |
| WO | WO-2009141319 A1 | 11/2009 |

\* cited by examiner

PRINTING APPARATUS WITH ROTATABLE TRANSPORT PENDULUMS

CROSS-REFERENCE TO RELATED AMPUTATIONS

This application is a 371 U.S. National Phase of International Application No. PCT/EP2018/056930, filed Mar. 20, 2018, which claims the benefit of German Patent Application No. 10 2017 204 630.9, filed Mar. 20, 2017. The entire disclosures of the above applications are incorporated herein by reference.

FIELD OF THE INVENTION

The invention relates to a printing apparatus for printing substrates, in particular solar cells, wafers, circuit boards or the like, having a printing device which is assigned at least one movable printing table having a conveyor track along which the substrates can be moved, and having a transport device for transporting the substrates from the conveyor track to the printing table and back.

BACKGROUND OF THE INVENTION

Printing apparatuses of such type mentioned are already known from prior art. For the handling of flat/planar substrates, in particular solar cells, wafers, circuit boards or the like, printing apparatuses which can move the substrates with sufficient care and precisely enough are necessary for the purpose of processing. Flat substrates common in electrical engineering are often printed with an electrically conductive paste to produce, for example, electrical conductors and/or electrically conductive contact points. Printing devices are known for this purpose, which, for example, apply a predetermined pattern of electrical conductor paths to the substrates by means of a metering blade which is pushed along a printing screen or a printing mask. Usually, such a printing apparatus has a printing table on which the substrate can be deposited. In this case, the printing table is movable to transport the substrate, for example, from a receiving position to a printing position relative to the metering blade and/or a printing mask. In order to move substrates onto and remove them from the printing table, a transport device is usually provided which grips and transports the substrates mechanically or pneumatically, for example. For the feeding and removal of the substrates, the device is known to transport or convey them along a conveyor track along which one or more such printing devices or other processing apparatuses are arranged. The transport device then removes a substrate from the conveyor track, for example, and feeds it to the printing table in order to move it back onto the conveyor track after the printing operation has been completed. The transport of the substrates from the conveyor track to a printing device and back requires a complex mechanism and actuator to ensure safe and fast transportation.

SUMMARY OF THE INVENTION

The object of the invention is to create an improved printing apparatus, which guarantees easy, safe and fast transport of substrates from the conveyor to a printing device and back, without the need of a complex actuator.

The object of the invention is achieved by a printing apparatus that has the advantage that the respective substrate is movable from the conveyor track to the printing device and back by a simple movement, which is achieved with particularly simple kinematics. At first, an actuator is sufficient to make the transport of the substrate possible. According to the invention, it is provided that the transport device has at least one transport pendulum which can be pivoted or rotated around a pendulum axis and which has a printing table at least one end at a distance from the pendulum axis, the printing table being pivotable by the transport pendulum into a first position assigned to the printing device for a printing operation and into a second position in the conveyor track, and the printing table having a conveying device in order to form the conveyor track in the second position as well. The transportation from the second position to the first position, or from the conveyor track to the printing device, thus takes place by means of a pivoting movement about the pendulum axis such that the printing table is moved along a circular path. Since the second position is in the conveyor track and the transport pendulum thus forms the conveyor track in the second position, a substrate is simply transported onto the printing table by the conveyor track itself, whereby the conveying device of the printing table simplifies the transport of the respective substrate onto the printing table and from the printing table onto the conveyor track. The conveying device also ensures that the printing table itself forms the conveyor track, so that a substrate can easily be conveyed over the printing table in the second position, for example to transport it past the printing device to a processing device further back in the production line. The printing apparatus therefore also has the advantage that a kind of bypass for substrates is provided through which the substrates can easily be passed past the respective printing device. A further advantage resulting from the design of the printing apparatus according to the invention is that the transport pendulum can be designed to pivot, for example by only 180.degree., so that no rotary feed-through of matter is required, such as air, vacuum or electricity to be guided to the pressure table. As a result, a simple mechanism and connection technology can be used. This results in advantages both in terms of cost and in terms of endurance of the printing apparatus.

According to a preferred embodiment of the invention, it is provided that in each case a printing table is arranged at at least two ends of the pendulum axis of the transport pendulum, whereby the frequency or the throughput of the printing apparatus is increased. In doing so, the transport pendulum carries two printing tables, which can be transported from the first to the second position by pivoting the pendulum axis by means of the transport pendulum. The printing tables are preferably arranged such that when one of the printing tables is in the first position, the other printing table is in the second position.

In particular, the printing tables are arranged diametrically opposite each other with respect to the pendulum axis in order to allow an easy transport movement of the transport pendulum, in which whenever one of the printing tables is in the first position, the other is arranged in the second position. This makes it possible, for example, that a substrate resting on one of the printing tables can be printed, while another substrate is conveyed over the printing table positioned in the conveyor track. Thus, during the execution of a printing operation, the conveyor track is not interrupted and the conveyance of substrates is ensured, so that the overall throughput of substrates by the printing apparatus is increased in a simple manner. Due to the advantageous integration of the transport device into the conveyor track, space-saving and constructively simple solution is also available.

Furthermore, it is preferably provided that the respective conveying device has a drivable conveyor belt, in particular a vacuum belt, paper belt or the like, which forms a substrate support for the substrates on the respective printing table. By means of the conveyor belt, the substrates can be easily conveyed over the printing table by means of the conveying device. The respective conveyor belt forms the substrate support for the substrates on the printing table. This is optionally equipped with several suction openings, which can exert a suction effect on a substrate resting on the conveyor belt, in particular through the vacuum belt or an air-permeable paper belt, in order to keep it positioned on the printing table, in particular during the printing process. In addition, the vacuum fixation also ensures that the substrate remains securely on the printing table when the transport pendulum pivots. In contrast to the paper belt, the vacuum belt itself must have its own vacuum or suction openings and is otherwise preferably made of an air-impermeable material, in particular an elastically deformable material, which offers defined elastic support for the respective substrate, whereby the elasticity of the support is defined, for example, by its shore-hardness and can be adjusted by a suitable material selection. Preferably, the respective conveying device either has a conveyor belt which extends over at least substantially the entire printing table to provide a large support surface area for the respective substrate, or at least two or more parallel conveyor belts on which the substrate can be placed and which together form the substrate supports.

The respective conveying device preferably has an exchangeable conveyor cartridge. Alternatively, the conveying device is designed as a replaceable unit, for example in the form of a conveyor belt cartridge, with optional integrated drive direction. Thus, the conveyor belt is easily replaceable during maintenance or cleaning by replacing the conveyor cartridge. As a result, cost effective and fast maintenance and repair of the printing apparatus is possible.

Furthermore, the invention preferentially foresees that the conveyor track for each of the transport pendulums has an interrupted section, or an interruption, with the respective printing table filling or replacing the interrupted section in the second position in order to complete the conveyor track. The conveyor track thus has an interruption for the respective transport pendulum, which can be filled by one of the printing tables in order to continue the conveyor track. The printing table of the transport pendulum thus completes the conveyor track in the second position so that it forms a continuous conveyor track along which substrates can be conveyed past the one printing device to a further processing station, in particular a further printing device.

Furthermore, it is preferred that the respective pendulum axis is aligned vertically so that the respective printing table is moved in a horizontal plane by the transport pendulum, and in particular pivoted. As a result, the transport pendulum is inexpensive and structurally easy to store. By pivoting around the vertical axis, the transport pendulum only requires sufficient space in the horizontal plane to avoid collision with other components of the printing apparatus. In order to form the conveyor track in the second position, the transport pendulum is pivotable, for example, such that the printing table assigned to the conveyor track comes to rest on the conveyor track and picks up substrates conveyed along the conveyor track and further conveys them by means of the conveying device. The printing table preferably has a feed slant and removal slant, which make it easier to lift and pick up the substrates from the conveyor track or to place the substrates on the conveyor track.

According to a preferred embodiment of the invention, it is provided that at least the substrate support of each printing table is vertically displaceable. This ensures that the respective substrate support is adjustable in height or can be raised or lowered. This ensures that the substrate support can be easily guided, especially into the conveyor track or into the vicinity of the print mask or printing device. In particular, the transport pendulum is designed in such a way that the printing table is first moved below the conveyor track by the transport pendulum, which can be pivoted in the horizontal plane, and that the substrate support is lifted from below the conveyor track to complete the conveyor track, and inserted into the interruption of the conveyor track in order to fill or replace it. As a result, a simple completion of the conveyor track is ensured by the respective printing table or the transport pendulum in the second position of the printing table. In order to ensure easy insertion and positioning of the printing table in the first and/or second position, a centering apparatus, in particular a centering guide, is optionally assigned to the conveyor track, in particular to the printing table and/or the substrate support.

According to a preferred embodiment of the invention, it is intended that the first and/or second position of the respective printing table and/or at each printing table of the respective substrate, the support is assigned a lifting device for the respective substrate support. If the lifting device is arranged on the respective printing table in order to be able to raise or lower the substrate support located there if necessary, an additional actuator is to be carried along with the printing table, which ensures the raising and lowering of the substrate support. Although this ensures individual operation of the substrate supports in terms of lifting, it does require appropriate installation space on the respective printing table for the respective lifting device. If the respective lifting device is assigned only to the first or second position of the respective printing table, i.e. as a stationary lifting device of a printing apparatus, then the respective printing table can be constructed to save space and the transport pendulum can be realized with little intrinsic mass. The stationary lifting devices are especially designed to lift the substrate support of one of the first or second positioned printing tables. For this purpose, the lifting device comprises, for example, one or more punches, rams or the like, which can be passed either past the respective printing table or through an opening of the respective printing table in order to lift the substrate support and/or substrates positioned on the printing table. For this purpose, for example, the lifting device, by means of the ram or puncher, cooperate with the conveying device to raise or lower the conveyor belt as a whole. As a result, a simple and inexpensive lifting device is realized. Alternatively, the respective lifting device is designed to lift the entire printing table or the entire transport pendulum in order to lift the substrate support as well. For this purpose, the respective lifting device is, for example, assigned to the first or second position in such a way that it is able to raise or lower the respective printing table as required, i.e. to adjust its height (z-direction). In order to ensure safe interaction between the stationary lifting device and the movable printing table, it is in particular provided that centering aids are assigned to the lifting device which ensure safe feeding of the ram and/or puncher to the substrate support in the first or second position of the printing table. According to a further embodiment of the invention, it is preferably provided that the respective lifting device is moved along with the transport pendulum.

According to an alternative embodiment of the invention, it is provided that in each case the entire transport pendulum can be raised and lowered by the lifting device or adjusted in height in order to ensure the previously described arrangement of the printing tables and supply to the printing device or conveyor track. As a result, the number of lifting devices for the respective transport pendulum is reduced to one.

In particular, the respective lifting device is thus configured to lift a substrate from a transport position to a printing position on the printing device or into a conveying position on the conveyor track. This results in the advantages already specified above.

Furthermore, it is preferably provided that the transport device has at least one further transport pendulum which is designed as the other transport pendulum and is arranged next to it. Thus, the printing apparatus has at least two transport pendulums, which are arranged side by side. The conveyor track has interruptions corresponding to the number of transport pendulums, so that each transport pendulum is assigned a second position in or on the conveyor track in which a printing table of the respective transport pendulum can be arranged in order to form the conveyor track as described above.

The transport pendulums are preferably arranged so close to each other that the movement paths of their printing tables overlap. As a result, the printing apparatus is designed particularly space-saving. Appropriately, the transport pendulums are driven in such a way that they do not collide with each other during operation. This results in an operation of the transport pendulums similar to that of a roots blower, for example. Therefore, the transport pendulums are formed in a roots arrangement.

The transport pendulums are preferably mechanically or electrically coupled to each other in order to, in particular, implement the drive described above. Due to the mechanical coupling, a collision of adjacent transport pendulums can be reliably and permanently avoided. In addition, an additional drive for the additional transport pendulum is not necessary. This results in a compact and energy-saving embodiment of the printing apparatus. As a result of the electrical coupling, the actuators assigned to the transport pendulums are actuated independently of one another in order to achieve the pivoting of the respective transport pendulum. The electrical coupling allows an individual transport pendulum drive, which also allows, for example, that the transport pendulums are at least temporarily aligned parallel to each other. This results in further freedoms in the operation of the printing apparatus. Optionally, the conveying devices of the printing tables, in particular those of a transport pendulum, are driven together.

Furthermore, it is preferably provided that the transport tables are assigned in their first position of a common printing device or in each case a separate printing device. Thus, the two transport pendulums can interact with a single printing device or with two different or at least separately formed printing devices that can be operated in particular independently. Depending on process requirements, combinations of filter adjustment mechanics, a common metering blade and/or flood movement axis or multiple filters can be formed together. Individual elements can also be provided in duplicate, i.e. not together, but separately.

According to a further embodiment of the invention, it is preferably provided that the pendulum axis is aligned horizontally, so that the respective printing table is pivoted or rotated by the transport pendulum in a vertical plane. Thus, a printing table is raised by the transport pendulum and guided along a circular path to the printing device or the conveyor track. As a result, space can be saved in particular in the direction of the conveyor track, but space in the vertical plane of the transport pendulum movement is certainly required.

BRIEF DESCRIPTION OF THE DRAWINGS

In the following, the invention will be explained in more detail with reference to the drawing. For this

DETAILED DESCRIPTION OF THE DRAWINGS

Figure 1:
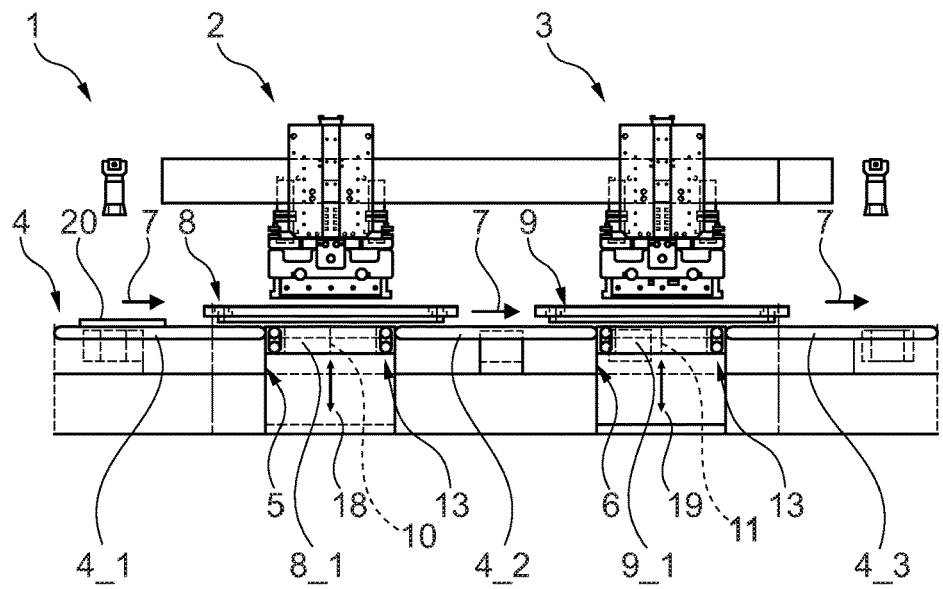
FIG. 1 shows an advantageous printing apparatus from its side view.

FIG. 1 shows a simplified side view of a printing apparatus 1, which is adapted to substrates such as solar cells, wafers, printed circuit boards or the like, to be printed by means of a particular electrically conductive printing paste. The printing apparatus 1 shows two juxtaposed printing devices 2 and 3. The printing devices 2, 3 are assigned a conveyor track 4 along which substrates can be guided to the printing devices 2, 3 or past them. For this purpose, the conveyor track 4 has several conveyor track sections 4_1, 4_2 and 4_3 arranged one behind the other in series by which a first interruption 5 is formed between the conveyor track sections 4_1 and 4_2 and a second interruption 6 is formed between the conveyor track sections 4_2 and 4_3.

Figure 2:
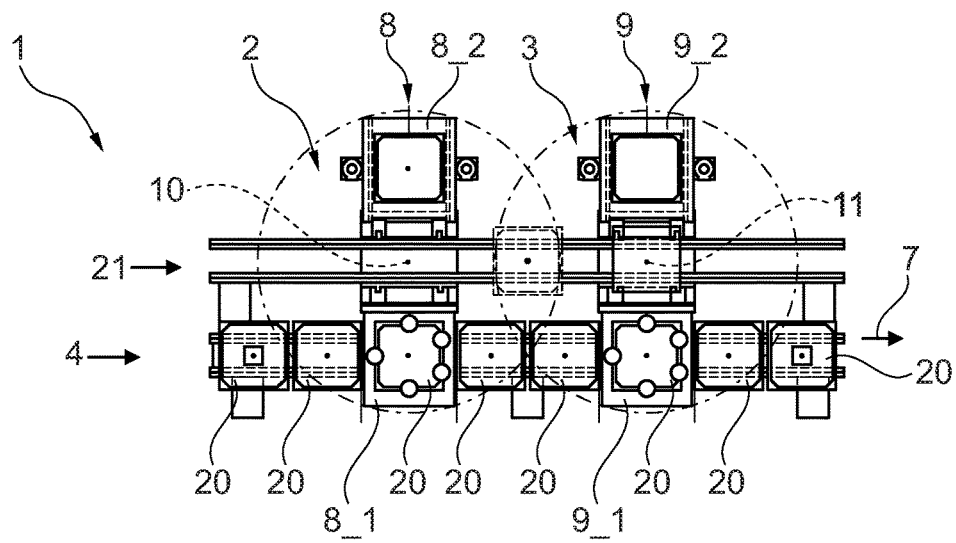
FIG. 2 shows the printing apparatus from its top view.

FIG. 2 shows the printing apparatus 1 in a simplified plan view. It can be seen that the conveyor track 4 is laterally at a distance from the printing devices 2 and 3 and passes them. The path of movement of the substrates along the conveyor track 4 is indicated by arrows 7 in FIG. 2 and FIG. 1. Each printing device 2, 3 is also assigned a transport pendulum 8, 9, which can be pivoted about a vertical pendulum axis 10 and 11 respectively. The respective transport pendulums 8, 9 have two diametrically opposed printing tables 8_1, 8_2 or 9_1 and 9_2, respectively, at a distance from the assigned pendulum axes 10, 11. The printing tables 8_1, 8_2, 9_1 and 9_2 are each arranged equally at a distance from the assigned axis of the pivoting or pendulum axes 10, 11. In the position shown in FIG. 2, the two transport pendulums 8 and 9 are aligned such that they are arranged parallel to each other. In this case, one of the printing tables 8_1 and 9_1 of the conveyor track 4 and the respective other printing table 8_2 and 9_2 of the respective transport pendulums 8 and 9 is assigned to one of the printing devices 2, 3. The transport pendulums 8, 9 form a transport device with the help of which substrates can be transported from the conveyor belt to the printing devices 2, 3 and back.

Parallel to conveyor track 4 runs another conveyor track 21, which is designed as a continuous conveyor track, and in this respect, conveys substrates past the printing apparatus 1 or the printing devices 2, 3, so that they do not perform any process steps on these substrates. Substrates that are located on the conveyor track 21 are processed, for example, with a printing apparatus designed analogously to the printing apparatus 1, which is arranged in front of or behind printing apparatus 1 in the conveying direction of the conveyor track 21. The other printing apparatus can be used/operated like the printing apparatus 1, so that it has, for example, transport pendulums with the same dimensions as the printing apparatus 1. Alternatively, the further printing apparatus can also be designed with shorter or longer transport pendulums, i.e.

with a larger or smaller radius, depending on whether the printing devices of the further printing device are closer or further away from the conveyor track 21 than the printing devices 2, 3 are from conveyor track 4.

The respective interruptions 5, 9 in the conveyor track 4 correspond at least substantially to the width of one of the printing tables 8_1 to 9_2. Because printing tables 8_1 to 9_2 are each of the same design, reference will hereinafter be made to the printing table(s) for the sake of simplicity.

The pendulum axes 10, 11 are arranged at a distance from the conveyor track 4 in such a way that in the parallel alignment of the transport pendulums 8, 9 shown, one of the printing tables 8_1 or 9_1 is arranged exactly in the respective interruption 5, 6 of the conveyor track 4, and thus completes the conveyor track 4.

Figure 3:
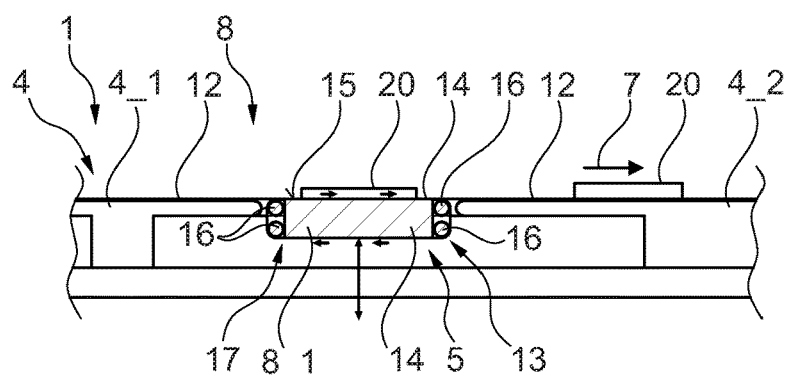
FIG. 3 shows a detailed illustration of the printing apparatus and FIGS. 4A and 4B show the printing apparatus in different operating states to explain their functions.
Figure 4A:
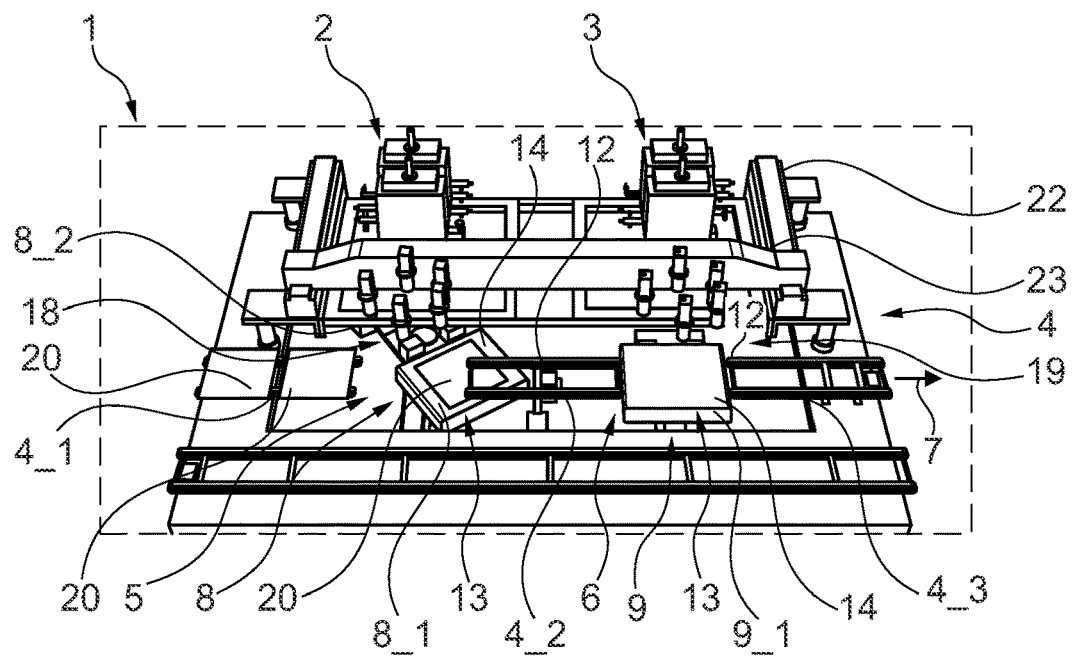
Figure 4B:
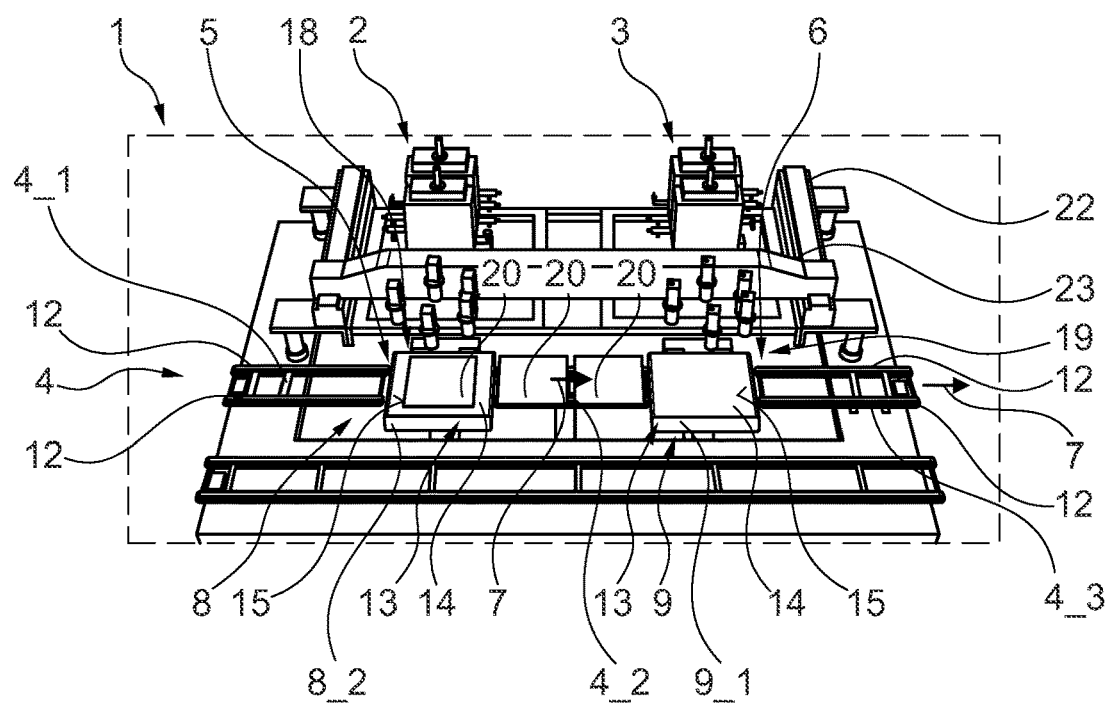

FIG. 3 shows, in a detail side view, the printing table 8_1 of the transport pendulum 8 in the region of the conveyor track 4. As already explained, the conveyor track 4 has conveying means for transporting the substrates. In particular, the conveyor track 4 has at least one conveyor belt 12 in the respective conveyor track sections 4_1, 4_2 and 4_3 by means of which the respective substrate can be transported. Advantageously, the conveyor track 4 has at least two conveyor belts 12 which are parallel aligned and at a distance from one another in each conveyor track section, as shown in FIGS. 4A and 4B. Conveyor belts 12 or conveyor belt sections 4_1 to 4_3 together form a conveying plane on which the substrates can be conveyed. The printing tables are designed to complete this conveying plane of the conveyor track 4 when the printing table is in the respective interruption 5 or 6 of the conveyor track. Conveyor belts 12 may, as in the present case, be constructed as a flat belt or as a round belt or be constructed by means of other conveying elements, such as conveyor rollers or the like.

FIG. 3 shows how the printing table 8_1 is located in the interruption 5 of the conveyor track 4 between the conveyor track sections 4_1 and 4_2. The respective printing tables 8_1-9_2 itself have a conveying device 13 by means of which the substrates can be conveyed further along conveyor track 4, i.e. completing conveyor track 4. For this purpose, the respective conveyor 13 expediently comprises at least one drivable conveyor belt 14 and an actuator by means of which the conveyor belt 14 can be driven. Specifically, the actuator is an electric motor which, for example, controls the conveyor belt 14 in a speed-controlled or controlled manner. The conveyor belt 14 is aligned parallel or in alignment with the conveyor belts 12 of the conveyor track sections 4_1 to 4_3, so that the substrates along the conveyor track 4 can be conveyed along without interruption.

The conveyor belt 14 of the respective the printing table also serves as a substrate support 14 on the upper side of the printing table 8_1 on which the substrates are positioned. In the position shown in FIG. 3, the printing table 8_1 is arranged in interruption 5 of the conveyor track 4 in such a way that the substrate support 15 is flush with the conveyor belts 12 so that the substrates are also conveyed in the area of the printing table at the level of the conveyor plane as described above. This ensures safe transport of the substrates along the conveyor track 4 by placing one of the printing tables in each of the interruptions 5, 6. For the transport of the respective conveyor belt 14, the respective printing table or the respective conveyor device 13 has several deflection rollers 16, so that the conveyor belt 14 can be used as a continuous medium.

According to an optional advantageous embodiment, the conveyor belt 14 is provided as part of a conveyor belt cartridge 17 which can be arranged interchangeably on the respective printing table and operatively connected to the actuator or drive provided on the printing table. As a result, a simple replacement of the conveyor belt 14, for example, for maintenance purposes, is possible. This is particularly advantageous if the conveyor belt is a paper belt which shows signs of wear more quickly than, for example, a plastic belt. The conveyor belt cartridge 17 is removable, for example, radially to the pendulum axis 10 or 11 of the respective printing table to ensure easy replacement.

Optionally, it is provided that the conveyor belt 14 used is designed as a vacuum belt so that it is, for example, air-permeable or has air-permeable openings in such a way that a substrate can be sucked into the substrate support 15 by a vacuum generated in the respective printing table and can thus be locked to the substrate support 15 by means of a vacuum. This is particularly advantageous when the respective transport pendulum 8 and/or 9 is pivoted about the respective pendulum axis 10, 11 with substrates resting on the printing tables, as discussed in more detail below.

In order for the respective printing table to be able to be inserted into the respective interruption 5, 6 of the conveyor track 4, the height (z-direction) of the respective transport pendulum 8, 9 can be adjusted completely. A lifting device 18, 19 is assigned to each transport pendulum 8, 9 through which the entire transport pendulum 8, 9 can be lowered and lifted. Alternatively, printing tables 8_1 to 9_2 are individually adjustable in height or can be raised and lowered. In this case, each printing table 8_1 to 9_2 is assigned its own lifting device. The lifting devices can be carried with the transport pendulum or can be arranged stationarily on the conveyor track 4 and the respective printing device 2, 3 in order to lift or lower the printing tables or the substrate supports 15 as required.

As can be seen in particular from FIG. 2, the transport pendulums 8, 9 have the same design and, because of their rotatable arrangement on the respective pendulum axis 10, 11, have a circular trajectory whose maximum radius is shown in FIG. 2 by a dot-dash line in each case. It can be seen that the transport pendulums 8, 9 are arranged towards each other in such a way that the movement areas/movement paths overlap. In particular, it is provided that the transport pendulums 8, 9 are arranged so close to each other that if both pendulums, which are initially aligned parallel to each other, were rotated by 90.degree., the transport pendulums 8, 9 would collide with each other.

This arrangement also ensures at the same time that the transport pendulums 8, 9 are arranged so far from each other that when only one of the transport pendulums 8, 9 is rotated, a collision is reliably avoided. Advantageously, the transport pendulums 8, 9 are mechanically and/or electrically coupled to each other so that a collision of the transport pendulums 8, 9 is reliably avoided. For this purpose, the transport pendulums 8, 9 move in the manner of a Roots gearbox or blower, whereby a secure operation is permanently guaranteed. In particular, such an operation can also be realized simply by mechanical or electrical means which couple the transport pendulums 8, 9 with each other.

As already specified, the transport pendulums 8, 9 are designed in such a way that when one of the printing tables is situated in the conveyor track 4, the other printing table is assigned to the respective printing device 2 or 3. In the exemplary embodiment of FIG. 3, for example, the printing tables 8_2 and 9_2 are assigned to the respective printing device 2 or 3. In this case, the respective printing device 2, 3 has a printing mask, and for example a metering blade, by means of which the printing paste can be applied through the printing mask to the substrate. The printing masks are arranged in such a way that they are positioned at a height which is advantageous for the printing process with respect to the substrate, as shown in FIG. 3. This can be carried out so that the printing table located under the printing mask is in a raised position. This is achieved either by lifting the printing table locally under the printing mask or by lifting the entire transport pendulum 8, 9 as described above. It is also possible that, in the printing position, no lifting of the respective printing table is necessary since a distance between the printing mask and the substrate surface is present anyway, so that it is sufficient to swivel the printing table only horizontally at the printing position.

Furthermore, it is guaranteed that while a printing process can be carried out at the respective printing device 2, 3, a substrate can be conveyed past both printing devices at the same time at the conveyor track 4 with the aid of printing tables 8_1 and 8_2. Thus, the conveyor track is not interrupted during the implementation of a printing operation, but rather completed by the respective transport pendulums 8, 9.

FIGS. 4 A and 4 B each show a perspective view of the printing apparatus 1 in different functional states to explain the operation of the printing apparatus 1. Starting from the position of the printing table 8_1 shown in FIG. 3, the operation will be explained in more detail. First, a substrate 20 is conveyed by means of conveyor track 4 to the first interruption 5, in which printing table 8_1 is located. The conveying device 13 of the printing table 8_1 is driven to receive the substrate 20 and in particular to place it centrally on the printing table 8_1, as shown in FIG. 3. Subsequently, the lifting device 18 is actuated to lower the printing table 8_1 or the transport pendulum 8, so that the substrate support 15 lies together with the substrate 20 below the conveyor track 4.

Subsequently, the transport pendulum 8 is rotated by an actuator, in particular an electric motor, into a rotational movement, so that the printing table 8_1 is rotated away below the conveyor track 4 and fed to the printing device 2. At the same time, the printing table 8_2 initially assigned to the printing device 2 is moved by the printing device 2 in the direction of the conveyor track 4. As soon as the transport pendulum 8 has been pivoted by 180.degree., the lifting device 18 is actuated again in order to lift the transport pendulum 8, or only the respective printing table, so that now the printing table 8_2 completes the conveyor track 4, and the printing table 8_1 is assigned to the printing device 2 for performing a printing operation as shown in FIG. 4B. Accordingly, the transport pendulum 9 is operated. While a printing process is being carried out by the printing device 2, the transport pendulum 8 conveys substrates further to the printing table 9_1 of the second transport pendulum 9, which is located further behind in the conveying direction, by means of the now assigned printing table 8_2 in the conveyor belt 4. The substrate 20 is subsequently picked up accordingly and fed, for example, to the printing device 3 by lowering, pivoting and lifting the transport pendulum 9. This creates a printing apparatus with a very short cycle time or high throughput rates. Flooding and printing processes as well as substrate feeding and removal can be halted temporarily in whole. In this case, for cost reasons and depending on the process requirements, apparatuses such as, for example, an x, y, a filter position adjustment 22 and/or a metering movement axis 23 can be present or occur only once.

This shows that different substrates can be supplied to the printing devices 2, 3, for example. Due to the advantageous arrangement, the printing devices 2, 3 only accept every second substrate. If, for example, the substrates 20 of type A and B are arranged alternately on the conveyor track 4 in the row of supplied substrates, substrates 20 of type A will each be supplied to the printing device 2 by the transport pendulum 8 and the substrates 20 of type B will each be supplied to the printing device 3 by the transport pendulum 9.

In contrast to the illustrated embodiment, it is also conceivable, in principle, that the pendulum axes 10, 11 are aligned horizontally so that the printing tables 8_1, 9_2, 9_1, 9_2 are moved on a circular track in a vertical plane.

The invention claimed is:

1. A printing apparatus for printing on substrates, the printing apparatus comprising:
    at least one printing device assigned a plurality of movable printing tables, each movable printing table having a conveyor track, along which the substrates are movable, and having a transport device for transporting the substrates from the conveyor track to the at least one printing device and back,
    wherein the transport device has first and second transport pendulums, each pivotable or rotatable about a respective pendulum axis and each having one of the plurality of movable printing tables on at least one end at a distance from the pendulum axis,
    wherein each movable printing table of the plurality of moveable printing tables is inserted by the first transport pendulum into a respective first position assigned to the printing device for a printing operation and pivotable into a respective second position in the conveyor track,
    wherein each movable printing table of the plurality of movable printing tables has a conveying device which also forms the conveyor track in the second position of the at least one movable printing table, and
    wherein the second transport pendulum is arranged and assigned next to the first transport pendulum in close proximity in a roots-arranged such that movement paths of the plurality of moveable printing tables overlap, and the first and second transport pendulums are mechanically or electrically coupled to each other so that colliding of the movable printing tables is prevented.

2. The printing apparatus according to claim 1, wherein a respective-movable printing table is one each of two ends of a respective transport pendulum, the two ends being spaced from a a respective pendulum axis.

3. The printing apparatus according to claim 1, wherein each transport pendulum includes at least a first movable printing table and at least a second movable printing table, arranged diametrically opposite each other to a respective pendulum axis.

4. The printing apparatus according to claim 1, wherein the conveying device of each movable printing table has a drivable conveyor belt selected from a group consisting of a vacuum belt and paper belt, the drivable conveyor belt forming a substrate support for the substrate on an upper side of the at least one movable printing table.

5. The printing apparatus according to claim 4, wherein at least the substrate support of each movable printing table is vertically displaceable.

6. The printing apparatus according to claim 1, wherein the conveying device of each movable printing table having an exchangeable conveyor belt cartridge.

7. The printing apparatus according to claim 1, wherein the conveyor track has an interruption for each of the at least one transport pendulum, which can be filled or replaced by a respective printing table in order to complete the conveyor track.

8. The printing apparatus of claim 1, wherein the at least one pendulum axis is vertically aligned, so that the at least one printing table is movable in a horizontal plane by the at least one transport pendulum.

9. The printing apparatus according to claim 1, wherein at the first and/or second position of each movable printing table and/or at each movable printing table a lifting device is arranged for a respective one of the at least one substrate support.

10. The printing apparatus according to claim 5, wherein the lifting devices are designed to lift a substrate from a transport position to a printing position on the printing apparatus and/or into a conveying position on the conveyor track.

11. The printing apparatus according to claim 1, wherein the transport pendulums are assigned in their first position to a common printing device or in each case to a separate printing device.

12. The printing apparatus according claim 1, wherein a distance between the respective pendulum axes of the first and second transport pendulums is smaller than a radius of the first and second transport pendulums combined.

* * * * *